United States Patent
Wagensohner et al.

(10) Patent No.: US 7,474,234 B2
(45) Date of Patent: Jan. 6, 2009

(54) SERIAL INTERFACE CIRCUIT FOR A SINGLE LOGIC INPUT PIN OF AN ELECTRONIC SYSTEM

(75) Inventors: Konrad Wagensohner, Mauern (DE); Anton Winkler, Dallas, TX (US); Markus Matzberger, Tiefenbach (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 11/876,207

(22) Filed: Oct. 22, 2007

(65) Prior Publication Data

US 2008/0136457 A1    Jun. 12, 2008

(30) Foreign Application Priority Data

Nov. 16, 2004    (DE)    ........................ 10 2004 055 299

(51) Int. Cl.
*H03M 5/08*    (2006.01)
(52) U.S. Cl. .......................................... 341/53; 341/50
(58) Field of Classification Search .............. 341/50–80
See application file for complete search history.

(56) References Cited

U.S. PATENT DOCUMENTS 5,157,400 A * 10/1992 Bang ........................... 341/166
5,457,716 A * 10/1995 Ang et al. .................... 375/344

* cited by examiner

*Primary Examiner*—Lam T Mai
(74) *Attorney, Agent, or Firm*—Warren L. Franz; Wade J. Brady, III; Frederick J. Telecky, Jr.

(57) ABSTRACT

A serial interface circuit for a single logic input pin of an electronic system, comprising a decoder for converting a pulse width modulated input signal applied to the pin to a sequence of logic low and logic high values. The decoder comprises an up/down counter with a count input connected to a clock source, an edge detection circuit detecting rising and falling edges of the input signal. The edge detection circuit is connected to the up/down counter to start up counting from a reset value upon detection of an edge in a first direction and to start down counting from a current count upon detection of an edge in a second direction. The decoder further comprises a bit value deciding circuit that delivers a first logic value when the count of the up/down counter is above the reset value on detection of an edge in the second direction and delivers a second logic value when the count of the up/down counter is at or below the reset value on detection of an edge in the second direction.

9 Claims, 2 Drawing Sheets

SERIAL INTERFACE CIRCUIT FOR A SINGLE LOGIC INPUT PIN OF AN ELECTRONIC SYSTEM

The present invention relates to a serial interface circuit for a single logic input pin of an electronic system.

BACKGROUND

Small electronic systems implemented as integrated circuits may have a single input pin for receiving a static digital control signal. Examples are electric power management systems such as DC/DC converters, charge pumps, linear regulators and battery chargers. These systems often have a "mode pin", i.e. a single input pin for application of an external digital mode selection signal. In the case of a DC/DC converter, for example, a power saving mode of operation may be provided, and the converter is switched between a normal operating mode and the power saving mode by application of an external mode selection signal to the mode pin. Additionally, these systems usually need to be configured. Reverting to the example of a DC/DC converter, various settings such as output voltage, output current, current limitation etc. must be made. These settings are usually made with an external resistor network and associated switches, for example. An alternative is digital programming of the system. While digital programming is a desirable feature in terms of flexibility and reduction in the number of external components, current solutions require an I²C interface which needs considerable die space and adds considerably to the total system costs.

SUMMARY

The present invention provides an interface circuit that permits the use of a single input pin of an electronic system as an input for static digital control signals and for serial digital data without major limitations as to bit timing and bit transmission rate.

Specifically, the invention provides an interface circuit for a single logic input pin of an electronic system. The interface circuit comprises a decoder for converting a pulse coded signal applied to the input pin into a sequence of logic low and logic high values. The decoder has an up/down counter with a count input connected to a clock source and an edge detection circuit detecting rising and falling edges of the input signal. The edge detection circuit is connected to the up/down counter to start up-counting from a reset value upon detection of an edge in a first direction and to start down-counting from a current count upon detection of an edge in a second direction. A bit value deciding circuit delivers a first logic value when the count of the up/down counter is above the reset value on detection of an edge in the second direction and delivers a second logic value when the count of the up/down counter is at or below the reset value on detection of an edge in the second direction. Since the actual count of the counter is irrelevant and the decision on the logic value is only dependent on the criterion as to whether or not the count exceeds the reset value, the bit timing and the transmission rate of the input signal may vary in a wide range. There are only a few limitations that are easily respected. One limitation is the clock frequency that should be sufficiently higher than—the maximum expected frequency of the input signal. Another limitation is the duty cycle of the input signal, which should sufficiently distinguish a period that transmits a logic "0" from a period that transmits a logic "1".

In a specific embodiment, the bit value deciding circuit delivers a first static logic value in the event of an overflow of the up/down counter at an upper limit and delivers a second static logic value in the event of an overflow of the up/down counter at a lower limit. Thus, the single logic input pin can be used either to receive data transmitted as a pulse width coded signal or it can be used as a mode input, changing between two different states or modes according to the first or the second static logic value.

In the preferred embodiment, the electronic system is a slave system connected to a master system through a serial connection including the input pin on the side of the slave system, a serial input/output port on the side of the master system and a connection line between the input pin and the input/output port. The electronic system further includes a pull-up resistor connected to the input/output port and a controllable switch connected between the input pin and ground, enabling the slave system to provide an acknowledgement signal to the slave system by closing the controllable switch. In this embodiment the single logic input pin is also used as an output pin which delivers an acknowledgement signal. Thus, the master system can be sure that the data has been transmitted correctly.

BRIEF DESCRIPTION OF THE DRAWINGS

Further advantages and features of the invention will become clear from the following description with reference to the appending drawings. In the drawings.

DETAILED DESCRIPTION OF EXAMPLE EMBODIMENTS

Figure 1:
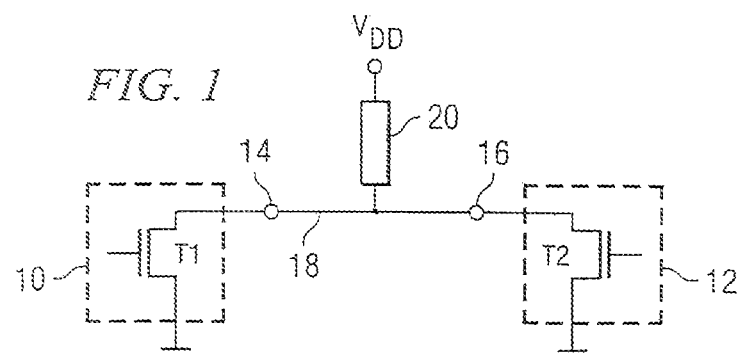
FIG. 1 is a block diagram of a small electronic system with a single input pin.

With reference to FIG. 1, a small electronic system is shown wherein the inventive serial interface is implemented. The electronic system includes a master system 10 and a slave system 12. In a specific embodiment master system 10 is a controller and slave system 12 a DC/DC converter. An input/output port 14 of master system 10 is connected to a logic input pin 16 of slave system 12 through a serial connection line 18. Connection line 18 is connected through a pull-up resistor 20 to a voltage supply VDD. In master system 10 a MOSFET transistor T1 is connected as a controllable switch between port 14 and ground. In slave system 12 a MOSFET transistor T2 is connected as a controllable switch between logic input pin 16 and ground. Logic input pin 16 is the mode input of a DC/DC converter. By this mode input the mode of the DC/DC converter can be changed between e.g. a normal and a power saving mode depending on a static voltage value applied to mode input pin 16 via connection line 18. When input pin 16 is used as a mode input, MOSFET transistor T2 in the slave system 12 remains open. If MOSFET transistor T1 in master system 10 is opened, pull-up resistor 20 pulls the connection line up, so that a high voltage value is applied to input pin 16. When MOSFET transistor Ti is closed, connection line 18 is connected to ground, thus pulling the connection line down, therefore a low voltage value is applied to input pin 16. Inserting the inventive serial interface circuit in the DC/DC converter enables the electronic system to transmit serial digital data through connection line 18, because the inventive serial interface circuit can decode pulse width modulated data. Connection line 18 can even be used for a bidirectional data transmission. When slave system 12 sends data to master system 10, MOSFET transistor Ti is open. In this case, closing and opening of MOSFET transistor T2 changes the voltage level on connection line 18 as described above with reference to MOSFET transistor T1. The serial data transfer from the master system to the slave system may be used for example to configure the DC/DC converter.

Figure 2:
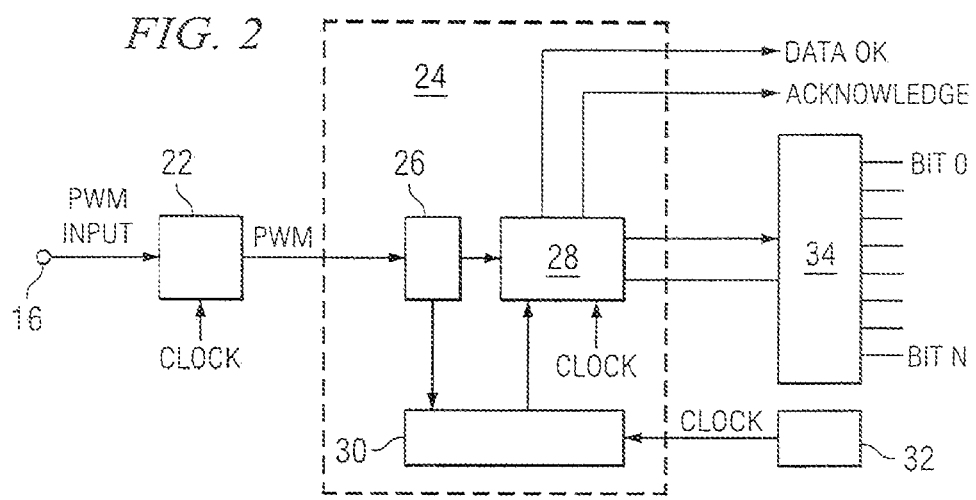
FIG. 2 is a block diagram of the inventive serial interface circuit.

FIG. 2 shows in a block diagram the serial interface circuit which is connected to logic input pin 16. The serial interface circuit includes a noise rejection filter 22 and a decoder 24. Noise rejection filter 22 is connected with an input to input pin 16 and with an output to decoder 24. It further receives a bit rate clock signal. Decoder 24 comprises an edge detection circuit 26, a bit value deciding circuit 28 and an up/down counter 30. Edge detection circuit 26 is connected between noise rejection filter 22 and bit value deciding circuit 28. Both are connected to up/down counter 30. Bit value deciding circuit 28 also receives a bit rate clock signal. A clock source 32 provides a clock signal at a frequency which is substantially higher than the bit rate. The output of the bit value deciding circuit is applied to a serial/parallel converter 34 by a bit line. The output of clock source 32 is applied to a clock input of the up/down counter 30.

In a data transmission operation, a pulse width modulated signal is applied to input pin 16. This PWM signal is first filtered in noise rejection filter 22 which eliminates short pulses in the input signal of a duration below a predefined limit. The bit rate clock signal applied to filter 22 allows to resynchronize the PWM signal. The filtered PWM signal is then output to decoder 24. Decoder 24 converts the pulse width modulated input signal to a serial sequence of logic low and logic high values. The function of decoder 24 will be explained with reference to FIG. 3. The serial signal is fed to serial/parallel converter 34 which converts the serial signal into a parallel signal. Decoder 24 can deliver an acknowledgement signal and a validation signal after a predetermined number of valid bits corresponding e.g. to a data frame are received.

Figure 3:
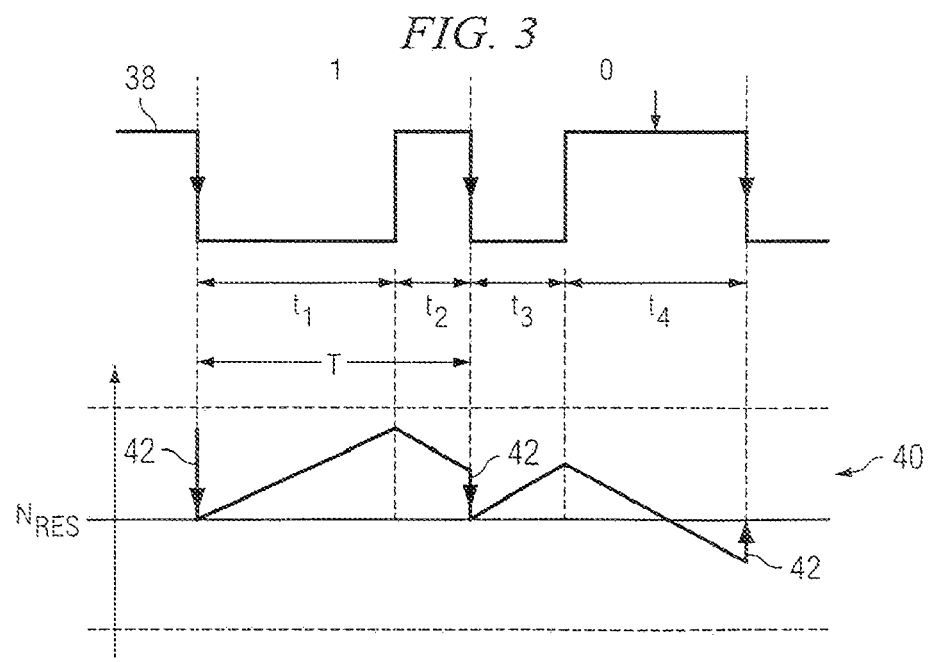
FIG. 3 is a signal diagram illustrating decoding of a pulse width encoded input signal.

Referring now to FIG. 3, the function of decoder 24 will be described. FIG. 3 shows a pulse-width modulated signal 38, related to a diagram 40 which shows the actual count value of up/down counter 30 over time. PWM signal 38 is encoded into pulses of short duration for a logical "1" and into pulses of long duration for a logical "0". The pulse sequence of PWM signal 38 has a period T, this corresponds to a bit rate of 1/T. In FIG. 3, the first bit is a, logical "1" with the PWM signal low during a time period t1 and high during a time period t2. The second bit is a logical "0" with a low PWM signal during a time period t3 and a PWM signal high during a time period t4. Other PWM signals may be used with other time periods for encoding the logical "1" and "0". Edge detection circuit 26 detects the falling edge at the beginning of each bit. The detection of a falling edge causes the transmission of a reset signal to counter 30. This is represented in diagram 40 by arrows 42. The value of up/down counter 30 is reset to reset value $N_{res}$. After receiving a reset signal counter 30 starts to count up with a frequency given by the clock signal output from clock source 32 which is applied to up/down counter 30. Diagram 40 shows the rising count value of counter 30. When edge detection circuit 26 detects the rising edge after time period t1, a signal is sent to counter 30 forcing the counter to start down counting starting from the current count. This is represented in diagram 40 by a falling count value during time period t2. When edge detection circuit 26 detects a falling edge after a bit duration T, the current count value is read by bit value deciding circuit 28. As this value is higher than reset value $N_{res}$, bit value deciding circuit 28 outputs a logical "1" to serial/parallel converter 34. When the counter value is read, counter 30 is reset to the reset value $N_{res}$ and restarts up counting. After time period t3 edge detection circuit 26 detects a rising edge and sends a signal to counter 30, forcing the counter to start down counting from the current count value. After time t4, edge detection circuit 26 detects a falling edge and forces bit value deciding circuit 28 to read the counter value. As the count value is below the reset value, bit value deciding circuit 28 outputs a "0" to serial/parallel converter 34. Counter 30 is reset and restarts counting up.

To summarize, with every beginning of a bit the counter value is read and counter 30 is reset. After a falling edge the counter counts up, and after a rising edge the counter counts down. If the period of up counting is longer than the period of down counting, the counter value at the beginning of the next bit will be above the reset value and if the duration of up counting is shorter than the duration of down counting, the value at the beginning of the next bit will be below the reset value. As long as time periods t1 respectively t3 differ sufficiently from time periods t2 respectively t4 and as long as the number of count steps is sufficiently high during each time period t1 to t4, the bit value deciding circuit will decide correctly. Thus, a great variation in data rate is allowed and the serial interface circuit is very flexible in respect to timing requirements.

If after a first reset signal, a static low signal is applied to input pin 16, counter 30 will up count until it reaches counter overflow. Detection of a positive counter overflow means a static low signal at input pin 16. A static high signal, after a rising edge, will lead to a negative counter overflow. Detection of a negative counter overflow means a static high value. Thus, the function of input pin 16 as a mode input is not disturbed.

Figure 4:
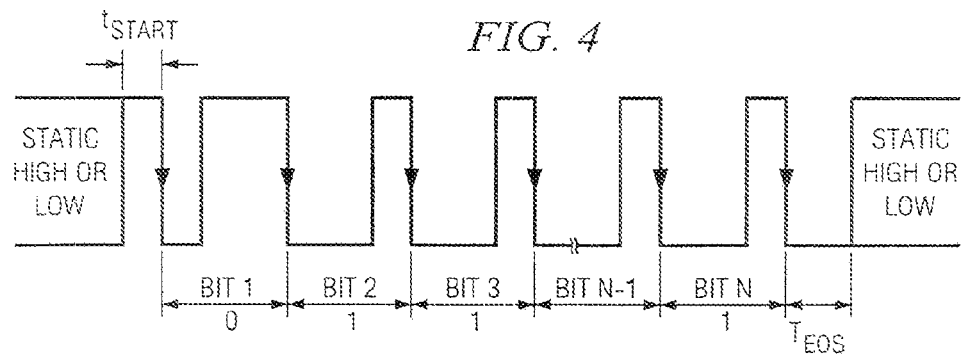
FIG. 4 is a timing diagram without acknowledgement of an N-bit data stream.

FIG. 4 shows a typical timing diagram of an N-bit data stream, showing the low or high values of the signal over the time. With no data transmission, logic input pin 16 is used as mode pin, this means that a static high or low signal is applied to logic input pin 16. To start a data transmission, first a high value is applied during a start time period $t_{Start}$, signaling that data transmission will occur, then data transmission of N bits will follow using pulse width modulation. This pulse width modulated signal is decoded by decoder 24 as explained with reference to FIG. 3. When transmission of the sequence of N bits is terminated, an "end of signal" signal which is of a low value is sent during a time period $t_{EOS}$. After the "end of signal" signal, the operation as mode pin is resumed.

Figure 5:
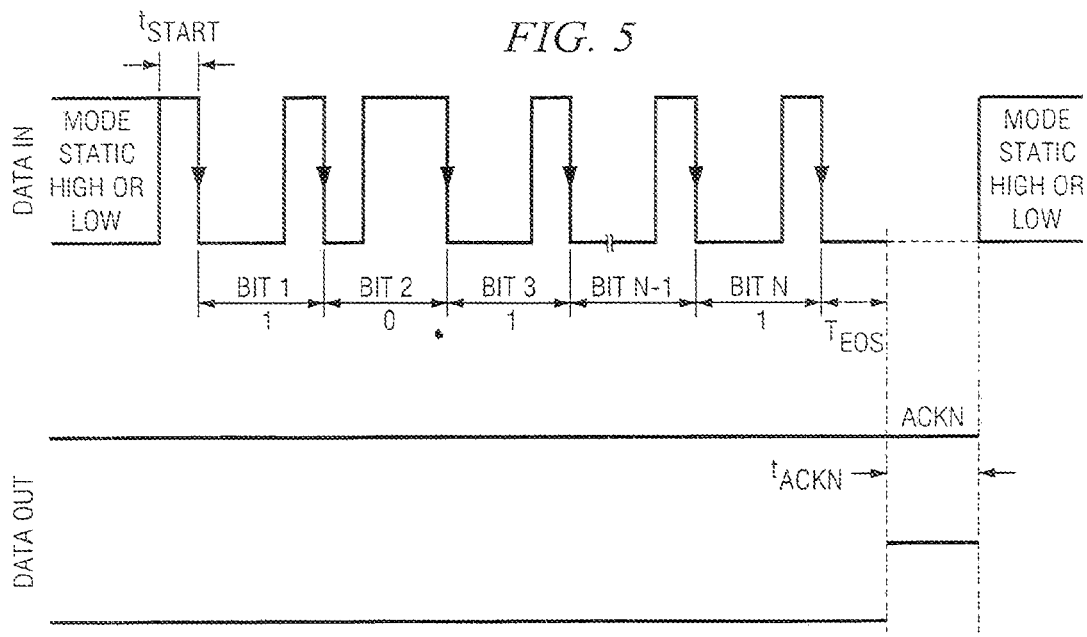
FIG. 5 is a timing diagram including acknowledgement of an N-bit data stream.

FIG. 5 shows a timing diagram of an N-bit data stream in an embodiment, in which slave system 12 can send an acknowledgement signal. As already explained with reference to FIG. 4, input pin 16 is used as mode pin when there is no data transmission and a static high or a static low value is applied to the pin. Data transmission starts with a high value during a start time period $t_{Start}$. Then the N-bit data stream will start with an RFA bit which is a bit representing a "request for acknowledgment". At the end of the N-bit data stream, a low value is sent as an "end of signal" signal during a time period $t_{EOS}$. After the "end of signal" signal, MOSFET transistor T1 must be opened to allow reception of an acknowledgement signal. The acknowledgement signal delivered by bit value deciding circuit 28 is fed to the gate of MOSFET transistor T2 thus closing MOSFET transistor T2. With MOSFET transistor T1 opened and MOSFET transistor T2 closed, connection line 18 is connected to ground pulling the voltage level of connection line 18 down. This is detected by master system 10. If MOSFET transistor T2 remains open, while MOSFET transistor T1 is open, connection line 18 is pulled up to a high voltage level by pull-up resistor 20. This allows for two different signal values as acknowledgement signal, with the switch T1 closed or opened. The acknowledgement signal is sent by slave system 12 during a time period $t_{ACKN}$. After transmission of the acknowledgement signal, the operation as mode pin is resumed. Of course, other embodiments are possible, where the slave circuit may even send a data stream.

Those skilled in the art to which the invention relates will appreciate that additions, substitutions, modifications and deletions can be made to the foregoing described embodiments without departing from the scope of the invention as otherwise set forth in the specification and claims.

The invention claimed is:

1. A serial interface circuit for a single logic input pin of an electronic system, comprising a decoder for converting a pulse width modulated input signal applied to said pin to a sequence of logic low and logic high values, said decoder comprising:
    an up/down counter with a count input connected to a clock source,
    an edge detection circuit detecting rising and falling edges of said input signal, said edge detection circuit being connected to said up/down counter to start up counting from a reset value (Nres) upon detection of an edge in a first direction and to start down counting from a current count upon detection of an edge in a second direction, and
    a bit value deciding circuit that delivers a first logic value when the count of the up/down counter is above the reset value on detection of an edge in the second direction and delivers a second logic value when the count of the up/down counter is at or below the reset value on detection of an edge in the second direction.

2. The serial interface circuit according to claim 1, wherein the up/down counter is reset to the reset value (Nres) on each detection of an edge in the second direction.

3. The serial interface circuit according to claim 2, wherein the reset value (Nres) is zero.

4. The serial interface circuit according to claim 1, wherein the bit value deciding circuit delivers a static logic value in the event of an overflow of the up/down counter.

5. The serial interface circuit according to claim 1, wherein the bit value deciding circuit delivers a first static logic value in the event of an overflow of the up/down counter at an upper limit and delivers a second static logic value in the event of an overflow of the up/down counter at a lower limit.

6. The serial interface circuit according to claim 1, further comprising a noise rejection filter that eliminates pulses in the input signal of a duration below a predefined limit.

7. The serial interface circuit according to claim 1, wherein the bit value deciding circuit delivers a validation signal after a predetermined number of valid bits corresponding to a data frame are received.

8. The serial interface circuit according to claim 1, wherein the electronic system is a slave system connected to a master system through a serial connection including the input pin on the side of the slave system, a serial input/output port on the side of the master system and a connection line between said input pin and said input/output port, and further including a pull-up resistor connected to the input/output port and a controllable switch connected between the input pin and ground, enabling the slave system to provide an acknowledgement signal to said master system by closing said controllable switch.

9. The serial interface circuit according to claim 8, wherein the master system is a controller and the slave system is a DC/DC converter.

* * * * *